United States Patent [19]

Rao

[11] Patent Number: 4,587,542
[45] Date of Patent: May 6, 1986

[54] GUARD RING FOR REDUCING PATTERN SENSITIVITY IN MOS/LSI DYNAMIC RAM

[75] Inventor: G. R. Mohan Rao, Houston, Tex.

[73] Assignee: Texas Instruments Incorporated, Dallas, Tex.

[21] Appl. No.: 83,928

[22] Filed: Oct. 11, 1979

[51] Int. Cl.[4] .................... H01L 29/78; H01L 27/02; G11C 11/24
[52] U.S. Cl. ................ 357/23.6; 357/23.11; 357/41; 365/149
[58] Field of Search .................. 357/41, 23; 307/238; 365/149

[56] References Cited

U.S. PATENT DOCUMENTS

| | | | |
|---|---|---|---|
| 3,573,509 | 4/1971 | Crawford | 357/41 |
| 3,863,065 | 1/1975 | Kosonocky | 357/24 |
| 4,044,373 | 8/1977 | Nomiya et al. | 357/41 |
| 4,160,985 | 7/1979 | Kamins et al. | 357/30 |

FOREIGN PATENT DOCUMENTS

| | | | |
|---|---|---|---|
| 2751592 | 5/1978 | Fed. Rep. of Germany | 365/149 |
| 2832764 | 2/1979 | Fed. Rep. of Germany | 357/41 |

Primary Examiner—Gene M. Munson
Attorney, Agent, or Firm—John G. Graham

[57] ABSTRACT

An MOS/LSI type dynamic RAM with single 5 V supply and grounded substrate employs a guard ring surrounding the cell array to prevent pattern sensitivity in testing. The guard ring is an N+ region biased at Vdd over a deep P+ region in a P-substrate, producing a built-in electric field which attracts diffusing minority carriers into a collecting junction. A standard process for making double-level poly memory devices is modified by adding a P+ implant and deep drive-in prior to field oxidation.

7 Claims, 8 Drawing Figures

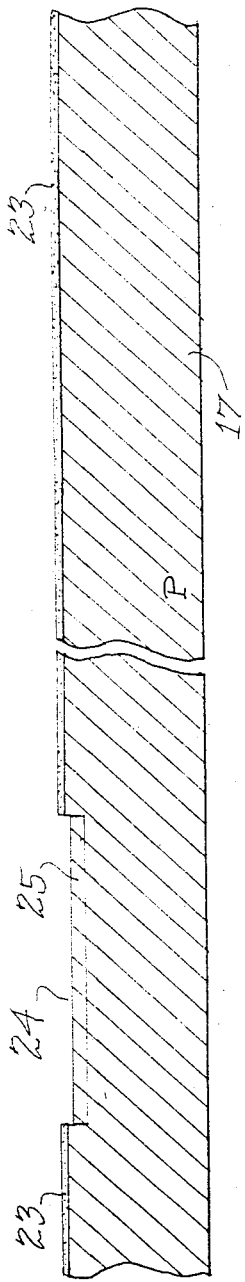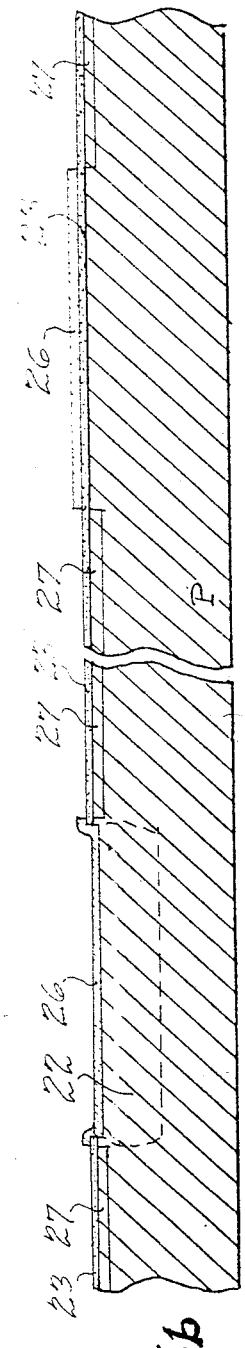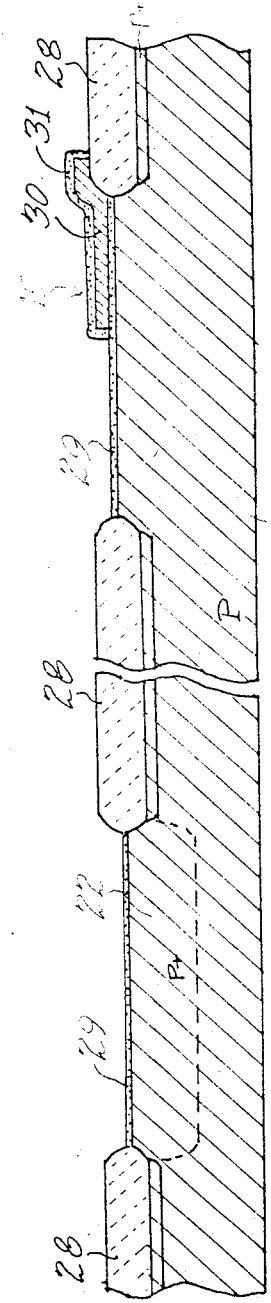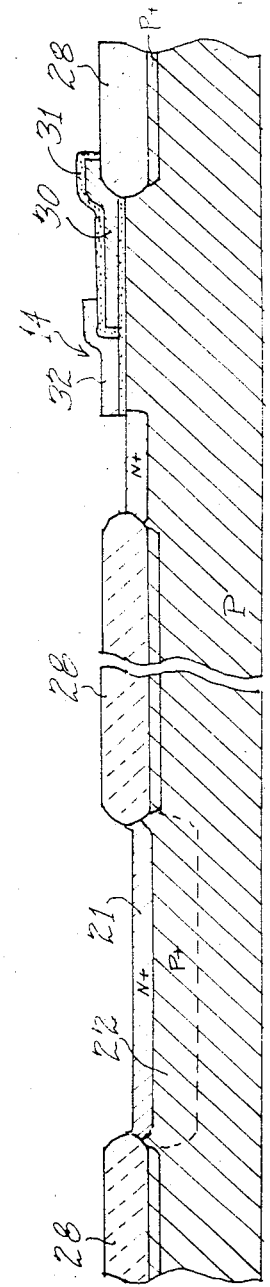

GUARD RING FOR REDUCING PATTERN SENSITIVITY IN MOS/LSI DYNAMIC RAM

BACKGROUND OF THE INVENTION

This invention relates to semiconductor devices and methods of manufacture, and more particularly to a technique for preventing pattern sensitivity in a dynamic RAM type of memory device.

Manufacture is well underway of MOS/LSI type dynamic memory devices having 64K bit density and a single 5 V supply as described in Electronics, Sept. 28, 1978, pp. 109-116 Single 5 V supply dynamic RAMs offer substantial advantages over the previous generations of three-supply dynamic RAMs, such as the 4027 and 4116 devices, in the areas of reduced power dissipation, easier PC board layout, total TTL compatibility, etc. However, the −5 V substrate supply used in these prior 4K and 16K dynamic RAMs not only provided an adjusted internal threshold voltage for input TTL compatibility but also protected the internal nodes from ever being forward biased whenever significant current transients occur—it is not uncommon for dynamic RAMs to exhibit 50 to 100 MA transients. Huge transients in high performance devices almost preclude the use of on-chip substrate bias generators because these circuits can supply at best several hundred microamps. Consequently, devices as described in the above-mentioned Electronics article use a grounded substrate so as not to compromise the speed of the part as would be necessary if an on-chip substrate bias were employed.

With all its advantages, grounded substrate bias has one disadvantage: unless adequate protection is made on all nodes, there is a possibility that minority carriers injected into the substrate will diffuse to the areas of the storage capacitors and discharge these nodes which store charge dynamically. This condition can cause failure upon testing the devices after manufacture; the test patterns are indeed much more stringent than occur in normal operation. Patterns of "1's" and 0's" are written in and read out to detect "pattern sensitivity." An extremely tough pattern that is normally used in testing by manufacturers and users of dynamic RAMs is called "refresh disturb," as will be later described.

It is the principal object of this invention to provide an improved semiconductor memory device and method of manufacture. Another object is to provide improved dynamic RAM devices which have single 5 V supply and no substrate bias, particularly such devices which do not exhibit pattern sensitivity upon testing.

SUMMARY OF THE INVENTION

In accordance with one embodiment of the invention, an MOS/LSI type dynamic RAM with single 5 V supply and grounded substrate employs a guard ring surrounding the cell array to prevent pattern sensitivity in testing. The guard ring is an N+ region biased at Vdd over a deep P+ region in a P− substrate. A standard process for making double-level poly memory devices is modified by adding a P+ implant and deep drive-in prior to field oxidation.

BRIEF DESCRIPTION OF THE DRAWINGS

The novel features believed characteristic of the invention are set forth in the appended claims; the invention itself, however, as well as other features and advantages thereof, will best be understood by reference to the following detailed description of a particular emodiment, read in conjunction with the accompanying drawings, wherein:

FIGS. 5a-5d are elevation views in section of a very small part of the semiconductor device of FIG. 1, corresponding to the view of FIG. 4, showing successive stages in the manufacturing process.

DETAILED DESCRIPTION OF SPECIFIC EMBODIMENT

Figure 1:
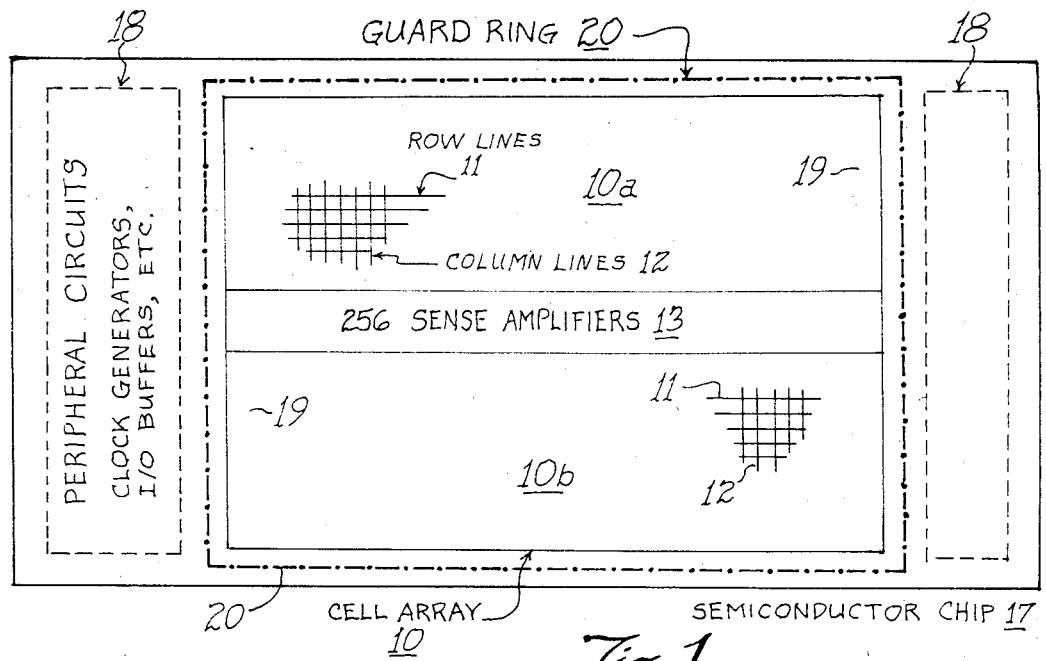
FIG. 1 is a plan view of an MOS/LSI semiconductor memory chip having the guard ring of the invention.
Figure 2:
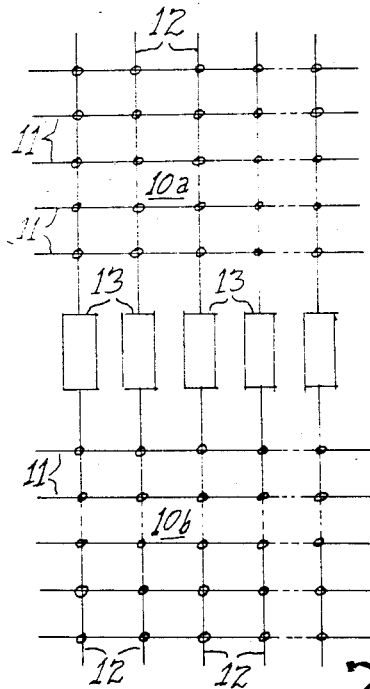
FIG. 2 is an electrical diagram in schematic form of parts of the memory system in the chip of FIG. 1.
Figure 3:
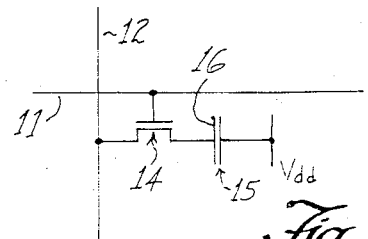
FIG. 3 is an enlarged view of part of the electrical diagram of FIG. 2, showing a single memory cell.
Figure 4:
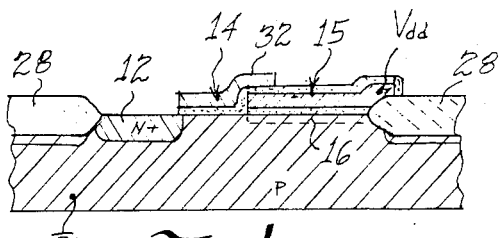
FIG. 4 is an elevation view in section of a very small part of the semiconductor substrate or chip of FIG. 1 showing the memory cell of FIG. 3 as constructed in semiconductor integrated circuit form.

Referring to FIGS. 1, 2, 3 and 4, a semiconductor memory device is shown which may use the concept of the invention. The memory device in this example is a 64K bit dynamic RAM as described in Electronics magazine, Sept. 28, 1978, pp. 109-116, or a device of similar construction; many different dynamic RAM devices of this general type are currently manufactured by companies in the semiconductor industry. The memory device includes an array 10 of "64K" or 65,536 one-transistor memory cells arranged in generally 256 rows 11 and 256 columns 12 but split into two array halves 10a and 10b containing 32,768 cells each. A set of 256 sense amplifiers 13 is positioned in the center of the array; each sense amplifier is a bistable circuit with differential inputs connected to column line halves as set forth in U.S. Pat. No. 4,081,701 issued to White, McAdams and Redwine, or pending application Ser. No. 944,822, filed Sept. 22, 1978, by McAlexander, White and Rao, both assigned to Texas Instruments.

Each cell in the array 10 includes a transistor 14 and a capacitor 15 constructed as in pending application Ser. No. 648,594 filed Jan. 12, 1976, by C-K Kuo, assigned to Texas Instruments. In this type of cell a stored logic "0" is the presence of minority carriers (in this case electrons) in an inverted storage region 16 which is one plate of the capacitor 15, while a stored logic "1" is the absence of minority carriers in the region 16 for the cell. During normal operation of the dynamic RAM the column line half 12 on either side of each sense amplifier 13 is precharged to a high voltage (approximately Vdd or 5 V) and, depending upon the signal level sensed for the cell for this column in the addressed row, a column line half will be either discharged to Vss (if "0" detected) while the other side remains at Vdd, or held high (if "1" detected) while the other side is discharged to Vss. Hence either in precharge or in active operation, 256 of the column line halves 12 will always have to be brought from Vss to Vdd or discharged from Vdd to Vss, respectively. Assuming approximately 0.6 pf column line capacitance, it is seen that a substantial amount of capacitive coupling to the substrate 17 exists due to the interaction of the bit lines. This is one source of minority carrier generation in the substrate.

Another source of minority carrier generation is in the end regions 18 of the substrate 17. In a dynamic RAM of this type most of the clock circuitry peripheral to the array is purely dynamic, and every time a gate is discharged a significant number of electrons are dumped back into the substrate 17. Some of these are collected by nodes at potential greater than Vss, and others recombine spontaneously. For typical silicon the lifetime is 40 to 50 microseconds; electrons can easily travel 10 mils before their number decreases by a factor of approximately 2.6—the classical diffusion length. The substrate 17 as seen in FIG. 1 has dimensions of about 180×110 mils, so electrons generated in clock circuits or the like in the ends 18 will reach the outer columns of cells in the array 10. The cells along the column lines 12 at the outer ends of the array are very susceptible while storing "1's" since diffusing electrons will be attracted to the area 16 of a cell by Vdd on the upper plate of the capacitor and may build up to a "0" or at least a soft "1."

An example of a phenomena observed in testing is as follows: (1) write background of "1's" in all cells in the array 10; (2) select one row 11 and repeatedly write "0's" in that row for one complete refresh period or approximately 4 ms; (3) read out the array. The "1's" in the columns 12 along the ends 19 are found to be substantially degraded. By repeatedly writing "0's" the discharging column lines are confined to only one array half 10a or 10b. This test sequence is repeated for a row 11 on the other side of the sense amplifiers 13 and the phenomena is duplicated. Because of the shape of the pattern of errors detected, this is referred to as a "goal post" failure, one example of pattern sensitivity.

In accordance with the invention, the minority carriers generated in the ends 18 are prevented from traveling through the substrate 17 and affecting "1's" stored in the columns 12 at the ends 19 of the array 10 by a guard ring 20. The array 10 is surrounded and isolated on all four of its sides by the guard ring 20 which is about one mil wide; the ring consists of an N+ region 21 biased at +Vdd and an underlying P+ region 22 in the P− substrate 17. This creates a potential barrier extending into the surface of the substrate a sufficient distance to trap and collect most of the drifting electrons which will be near the surface for the most part. Without the P+ region 22 underlying the junction, trapping would be insufficient.

A process for making the dynamic RAM device with the guard ring 20 will be described with reference to FIGS. 5a–5d. The starting material is a P− substrate 17; concentration of about $10^{15}$ per cm$^3$. After clean-up a thin thermal oxide coating 23 is grown to about 600 to 1000 Å. A photoresist and etch operation defines an opening 24 in the oxide 23, etching being in a plasma reactor with an oxygen environment. This "silicon etch" provides an easy level-to-level alignment for subsequent masks because about 500 Å of silicon is removed. A boron implant at about 200 KeV and about $10^{13}$ per cm$^3$ is performed, leaving a P+ region 25 which after drive-in will become the region 22. The boron is diffused into the substrate 17 a depth of 5 to 10 microns by subjecting the slice to 1000° C. for 24 hours in an inert atmosphere such as nitrogen or argon, producing the P+ tank region 22 in the P− substrate. Due to the heavy P+ dosage and subsequent localized damage due to implantation, the effective lifetime for minority carriers in the guard ring 20 in an order of magnitude smaller than in the remainder of the substrate 17.

The process is continued as seen in FIG. 5b depositing 1000 Å of silicon nitride 26 which is patterned to remove nitride where field oxide is to be grown, an "inverse moat" pattern. A boron implant produces regions 27 which will become the channel stops. Turning now to FIG. 5c, field oxide 28 is grown in areas not covered by nitride 26, then the nitride 26 and oxide 23 removed and a new thin thermal oxide 29 grown to provide the gate insulator for the capacitor 15. A first polycrystalline silicon layer is deposited and patterned to define the upper plates 30 of the capacitors, then a thermal oxide coating 31 grown over the first level poly. As seen in FIG. 5d, a second level of polysilicon is deposited and patterned to define the gates 32 of the transistors 14, after which an arsenic implant (using the same mask) and diffusion defines the N+ regions (about 0.5 microns in depth) which create the column line 12 as well as the N+ region 21 of the guard ring 20. Interlevel oxide is deposited (not shown) and patterned, after which aluminum is deposited and patterned to create the row lines 11 contacting the gates 32, as well as other interconnections.

Although the invention has been described with reference to a specific embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed:

1. A semiconductor memory device comprising an array of memory cells in a face of a semiconductor body, peripheral circuitry in said face spaced from the array, and a guard region positioned in said face between the array and said circuitry to prevent diffusion of minority carriers from said circuitry to the memory, the guard region comprising a shallow heavily-doped region of opposite type over a much deeper heavily-doped region of one type, the body being of said one type but of much lighter doping level.

2. A device according to claim 1 wherein the body is P− conductivity and the memory cells include N-channel MOS transistors.

3. A device according to claim 1 wherein the guard region is a ring completely surrounding said array.

4. A device according to claim 1 wherein said heavily-doped region of said one type is at least about ten times deeper than said heavily doped region of said opposite type.

5. A semiconductor device comprising an array of cells sensitive to minority carrier drift, the cells being formed in a face of a semiconductor body, peripheral circuitry in said face spaced from the array, the peripheral circuitry generating minority carriers, and a guard region positioned in said face between the array and said circuitry to prevent diffusion of minority carriers from said circuitry to the memory, the guard region comprising a shallow very heavily-doped region of one type, over a heavily-doped region of the opposite type, the body being of said opposite type but of much lighter doping level.

6. A device according to claim 5 wherein the body is P− conductivity and the cells include N-channel MOS transistors.

7. A device according to claim 5 wherein the guard region is a ring completely surrounding said array.

* * * * *